(12) United States Patent
Moulin

(10) Patent No.: US 6,369,936 B1
(45) Date of Patent: Apr. 9, 2002

(54) PIXEL INTENSITY CONTROL IN ELECTRO-OPTIC MODULATORS

(75) Inventor: Michel Moulin, Apples (CH)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 09/524,673

(22) Filed: Mar. 13, 2000

Related U.S. Application Data

(60) Provisional application No. 60/136,035, filed on May 26, 1999.

(30) Foreign Application Priority Data

| Mar. 12, 1999 | (EP) | 99104942 |
| Mar. 12, 1999 | (EP) | 99104943 |
| Jul. 2, 1999 | (EP) | 99112797 |

(51) Int. Cl.$^7$ .............. G02F 1/00; G02F 1/03; G06F 17/00
(52) U.S. Cl. .............. 359/323; 359/245; 359/254; 702/85
(58) Field of Search .............. 359/245, 254, 359/323, 322; 702/85

(56) References Cited

U.S. PATENT DOCUMENTS

| 4,371,892 A | 2/1983 | Mir | 358/75 |
| 4,636,039 A | 1/1987 | Turner | 350/356 |
| 4,796,265 A | 1/1989 | Asada et al. | 372/31 |
| 5,081,597 A | 1/1992 | Kowalski | 364/525 |
| 6,222,666 B1 * | 4/2001 | Moulin | 359/246 |

\* cited by examiner

*Primary Examiner*—Loha Ben
*Assistant Examiner*—Tim Thompson
(74) *Attorney, Agent, or Firm*—Baker Botts L.L.P.

(57) ABSTRACT

A laser imager comprises a modulator with an array of electrodes to control picture elements individually or by groups to produce images on a recording plane. The light intensity of each picture element or group of elements is determined by electrical potential applied between sets of controlling electrodes. These levels can be manually set or automatically exercised during a balancing routine through a feed-back loop using a photodetector to monitor and detect elements producing a light intensity higher than a set value. Control means assign to these elements a "correction voltage" to lower the density of elements they control. These correction values obtained after one or repeated balancing routines are stored in a memory and are used during the imaging cycle to produce images of substantially equal intensity on the recording medium. Different electrode arrangements to control the intensity of picture elements can be applied to different kinds of modulators and for different power levels of radiated energy.

31 Claims, 11 Drawing Sheets

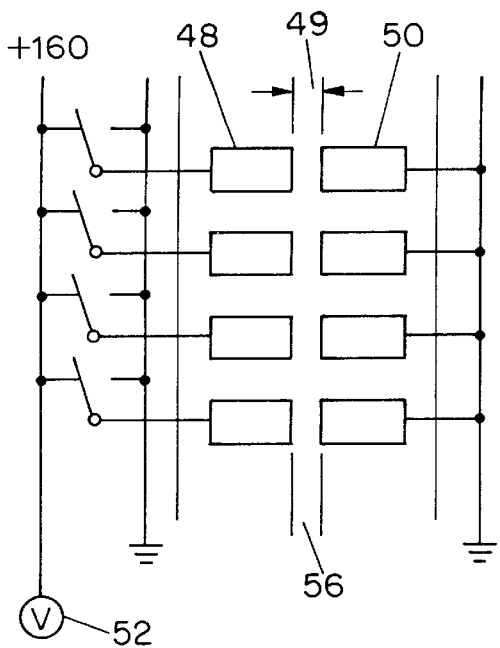 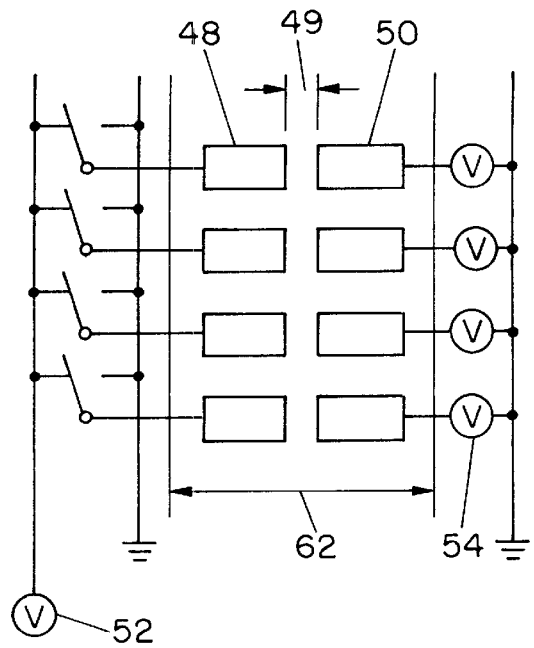
FIG. 3a    FIG. 3b
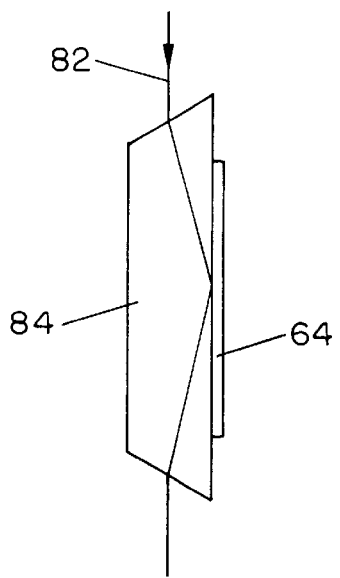 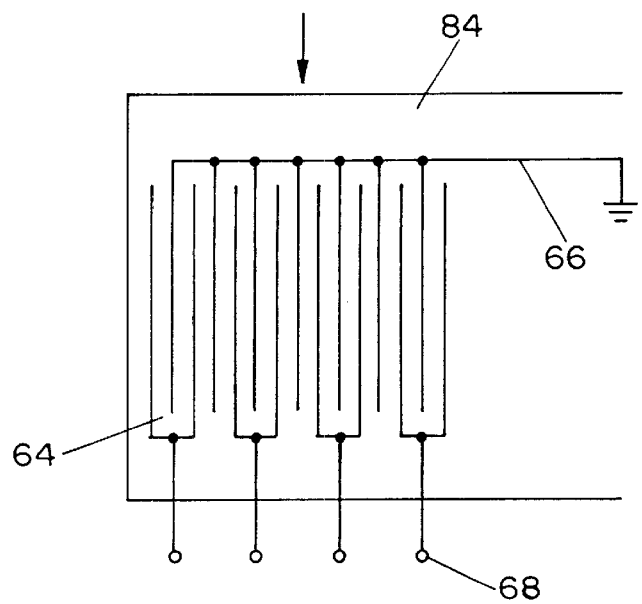
FIG. 3c    FIG. 3d

PIXEL INTENSITY CONTROL IN ELECTRO-OPTIC MODULATORS

CROSS REFERENCE TO RELATED APPLICATIONS

The present application is converted from and claims priority from provisional patent application Serial No. 60/136,035 filed May 26, 1999, which is incorporated herein by reference.

FIELD OF THE INVENTION

The present invention relates to intensity control of modulators used to form images on radiation sensitive media from a constant wave radiation beam. Although the invention can be applied to any system, it is particularly aimed at the imaging of printing plates sensitive to infrared radiation.

BACKGROUND OF THE INVENTION

The use of lasers associated with optical modulators for the exposure of printing plates is well known. For example a laser beam is directed to an array of electrodes located on a substrate, allowing emerging sub-beams to selectively reach a radiation sensitive media such as a printing plate. The transmission of each beam to the image receptor surface is selectively inhibited in accordance with a predetermined pattern or program. In a machine developed by applicant the laser beam is divided into 256 individually controllable "gates" allowing 256 pixels or light dots to reach the radiation sensitive surface or be prevented from doing so by stops or deflection means downstream of the modulator. However, the intensity of different pixels, may not be uniform along the line of pixels. Corrections should be introduced as found necessary following initial tests. Also, the intensity of various pixels constituting a light bar may vary during the operation of the imager. These variations may be caused by various factors for different reasons. Although they may be so small as to be acceptable for certain applications, they may not be acceptable for the production of high quality printing plates.

U.S. Pat. No. 4,780,731 describes a system for intensity control applied to a strip of light emitting diodes in which the regulation is obtained by affecting the duration of activated diodes. This system is not applicable to the production of bands or swaths as explained above because the exposure of a pixel is very short, of the order of 10 microseconds. The high frequencies necessary for such a mode are not possible in the present state of the art to control spatial electrooptic modulators.

SUMMARY OF THE INVENTION

The present invention relates to a method for the manual or automatic intensity control of each pixel or group of pixels by initial and periodic adjustment of the potential of gating electrodes. This adjustment is preferably accomplished by biasing the counter-electrodes individually or by groups without interfering with the control leads. This adjustment is independent of the control of selected marginal electrodes acting as an "electronic mask" as described in co-pending European Patent Application No. 99104942.0, which is incorporated herein by reference. The invention is not limited to a specific modulator. For example its scope covers PLZT as well as TIR modulators as either can accomplish the same function by similar means.

The present invention is applicable to the imaging of high quality thermal printing plates, for example, but without limitation, to machines and methods such as described in co-pending European Patent application No. 99112797.8, which is incorporated herein by reference.

BRIEF DESCRIPTION OF THE DRAWINGS

FIGS. 3-a and 3b are partial representations of a PLZT electroded modulator.

FIGS. 3-c and 3d are schematic partial representations of an electroded TIR modulator.

DESCRIPTION OF THE INVENTION

In the following description of the invention the terms "dots" or "spots" or "pixels" are used interchangeably. They all refer to elementary areas assembled in order to produce images. Also "radiation" or "light" is used to designate radiation of various wave lengths and "optical components" generally referred to as lenses (or other optical items) may differ in material composition or surface quality according to the wave lengths of the beams on which they act. "Electrodes" mean metal deposit on or close to an electrooptic media to control impinging light rays. "Imaging electrodes" refer to electrodes usually connected to a positive voltage source while "counter-electrodes" refer to adjacent electrodes usually connected to a ground potential. The OFF state of the modulator means that no or very little radiation can go through. The ON state means that most impinging radiation can go through. Finally, it is understood that the term "laser" encompasses any kind of system producing coherent light beams, such as laser diodes with or without scattered emitters.

Figure 1:
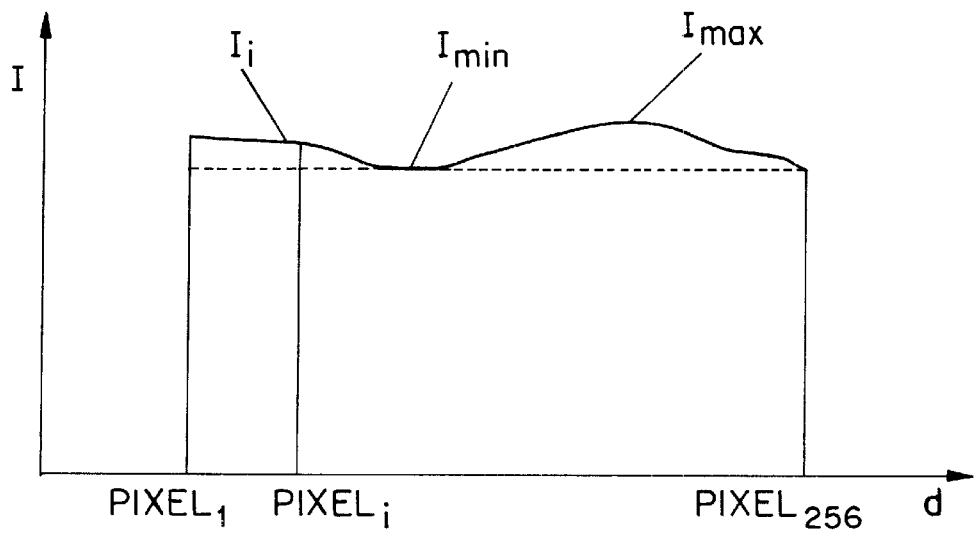
FIG. 1 represents light intensity variation of a line of pixels on the y axis, I along a line of pixels shown in the x axis d.

In the present description, the "OFF" state means that no radiation can reach the image plane. The "ON" state means that controlled radiation can reach the image plane. This control is preferably obtained by applying a selected bias potential to each electrode or group of electrodes. The method described in the present invention makes it possible to equalize pixel intensity to ±1%. This result, close to the ideal zero density variation is illustrated in FIG. 1 by a dotted line. The solid line represents a typical intensity variation of pixels not subjected to correction or calibration as per the present invention. Near uniform illumination between pixels within the limits shown is obtained by measuring means, by computation and by specific configuration of electronic circuits and of electrodes.

Figure 2:
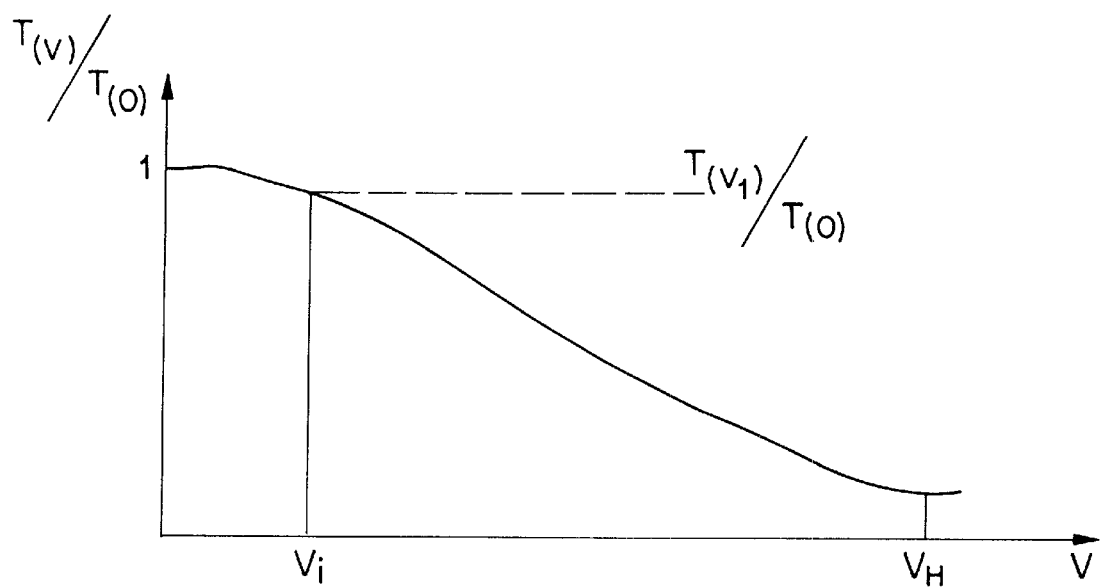
FIG. 2 is a curve representing the light transmission T as a function of the applied voltage to control electrodes of an electrooptic modulator, either for a PLZT modulator between two parallel polarizers or a TIR modulator in bright field mode.

The graph of FIG. 2 represents the light transmission T as a function of the applied voltage V to control electrodes of an electrooptic modulator that could be either a PLZT wafer associated with two parallel polarizers or a TIR modulator in the bright field mode.

PLZT modulators for high radiant energy are schematically represented in FIGS. 3a and 3b with two different wiring arrangements. In the example shown in these figures, electrodes 48 and 50 are located on each side of the PLZT substrate 62. The size of each electrode is 1.5 mm by 160 microns. The gap 49 between electrodes is 80 microns. A sheet-like bundle of rays illuminates the inter-electrode corridor 56. It may be longer than the length of the corridor and slightly narrower than gap 49. The width of the PLZT substrate is of the order of 6 mm.

A typical TIR modulator with interleaved electrodes located on the surface of a crystal as described in U.S. Pat. No. 4,281,904, is represented in FIGS. 3c and 3d. The line of light 82 enters the crystal 84 to be submitted to the influence of electrodes 64. The operation of the TIR modulator is similar to the operation of the PLZT modulator described above.

Figure 4:
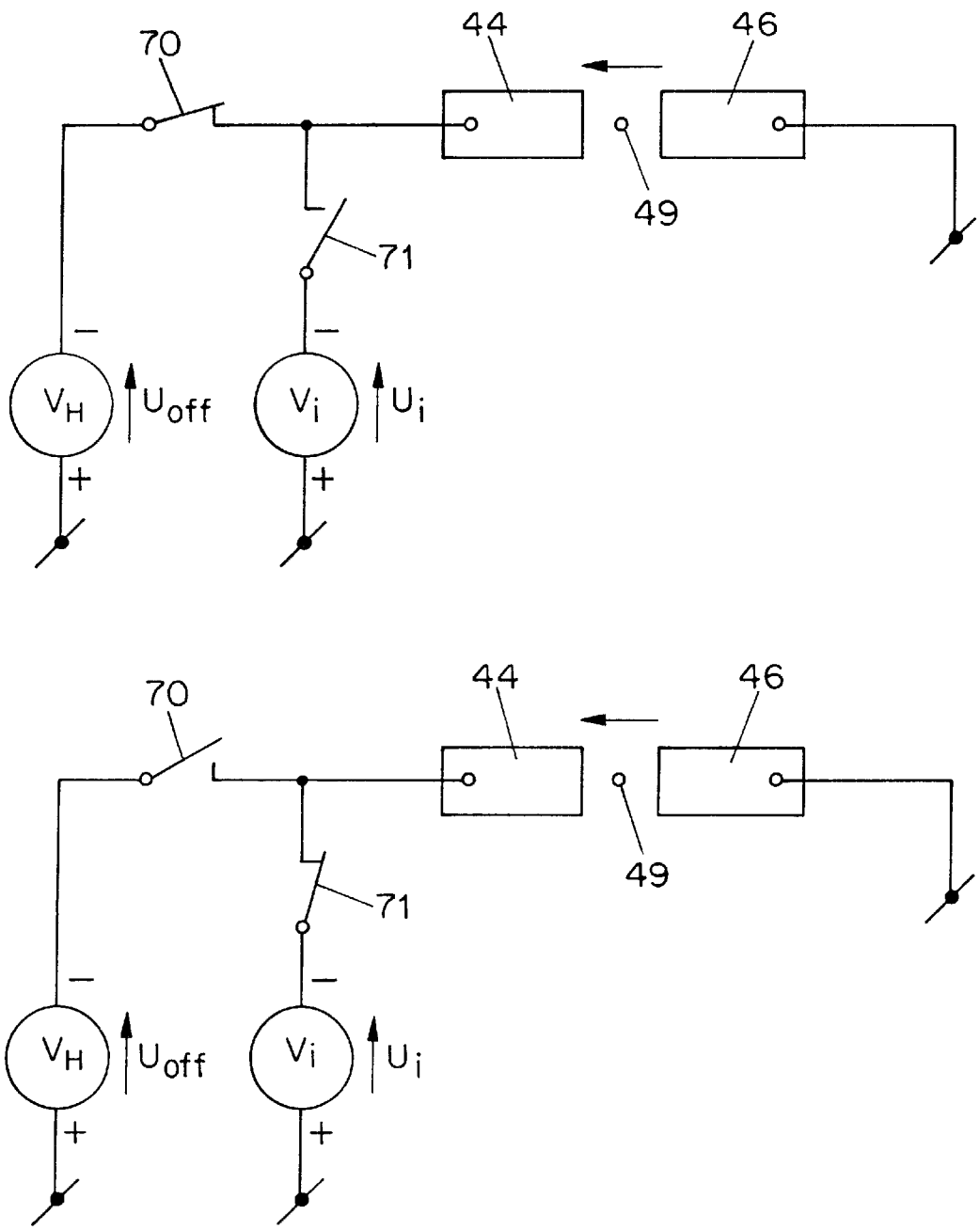
FIG. 4 shows how electric fields may be applied to a modulator to control the light reaching the imaging plane for correction purposes.

For correction purposes, in order to obtain a density curve similar to the one illustrated in FIG. 1, light equalization is obtained by selectively decreasing the amount of light received by pixels at the image plane whose intensity is above others. As illustrated in FIG. 4, this result is obtained by changing the potential between electrodes corresponding to pixels of higher intensity. In the top part of this figure, a "blocking potential" VH, through switch 70 is applied to the controlling electrode 44 to prevent the light from reaching the image plane. This state is referred as the (light) "Off" state as opposed to the "ON" state in which, no potential (except as may be necessary for correction purposes) appearing between electrodes, the maximum amount of radiation is allowed to reach the recording media located at the image plane. Correction is obtained by placing electrodes 44 and 46 under a selected potential to decrease the amount of light allowed to reach the recording media. Thus, in the lower part of the figure, switch 70 has been opened, cutting off the connection to potential VH and switch 71 has been closed connecting electrode 44 to a selected potential Vi to place it on its dependence for the purpose of lowering the intensity of pixels corresponding to points located above the ideal line of FIG. 1.

Figure 5:
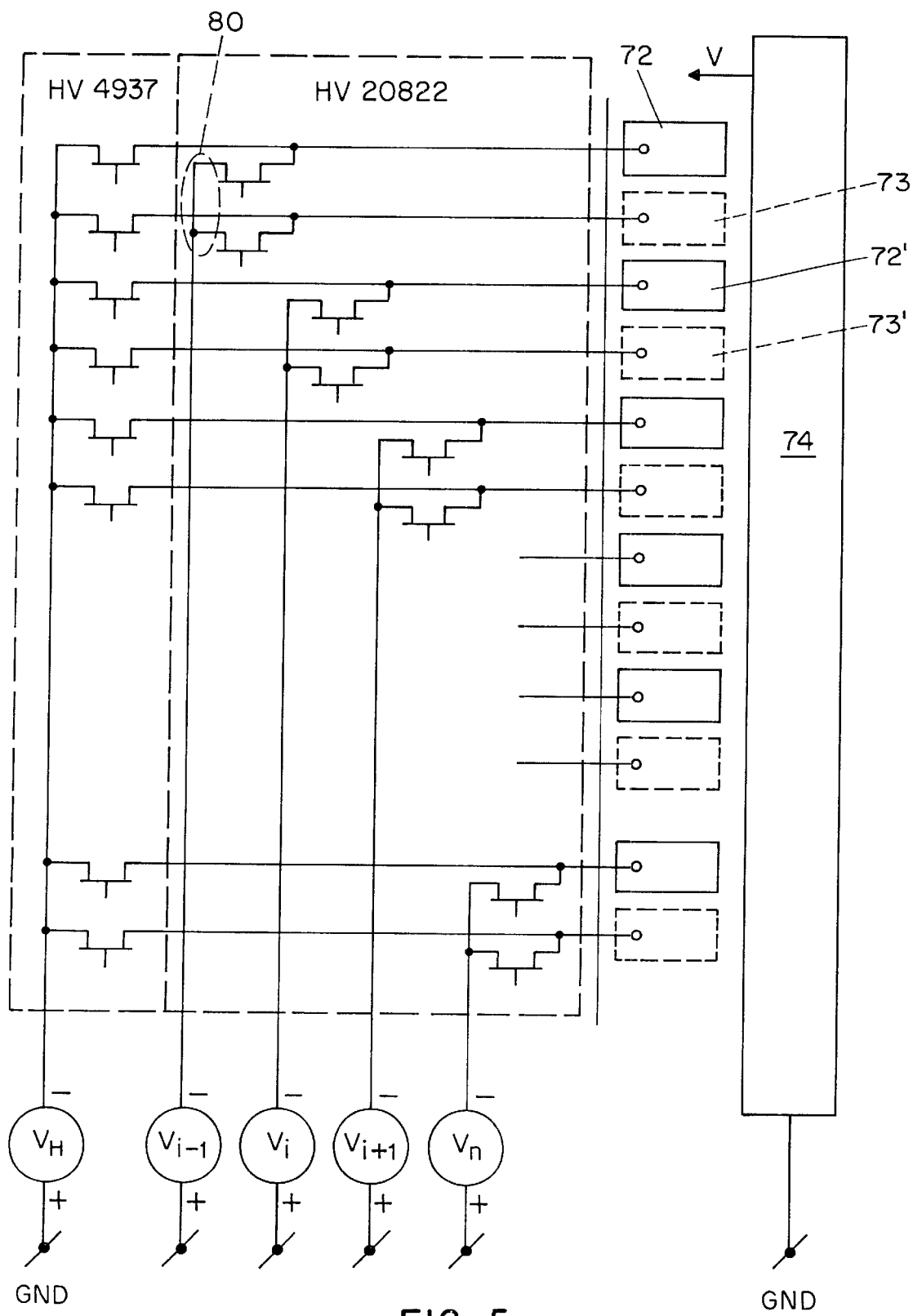
FIG. 5 schematically represents a circuit with a common counter-electrode. In this figure, as an example, the same electrical potential is applied every two electrodes.
Figure 6:
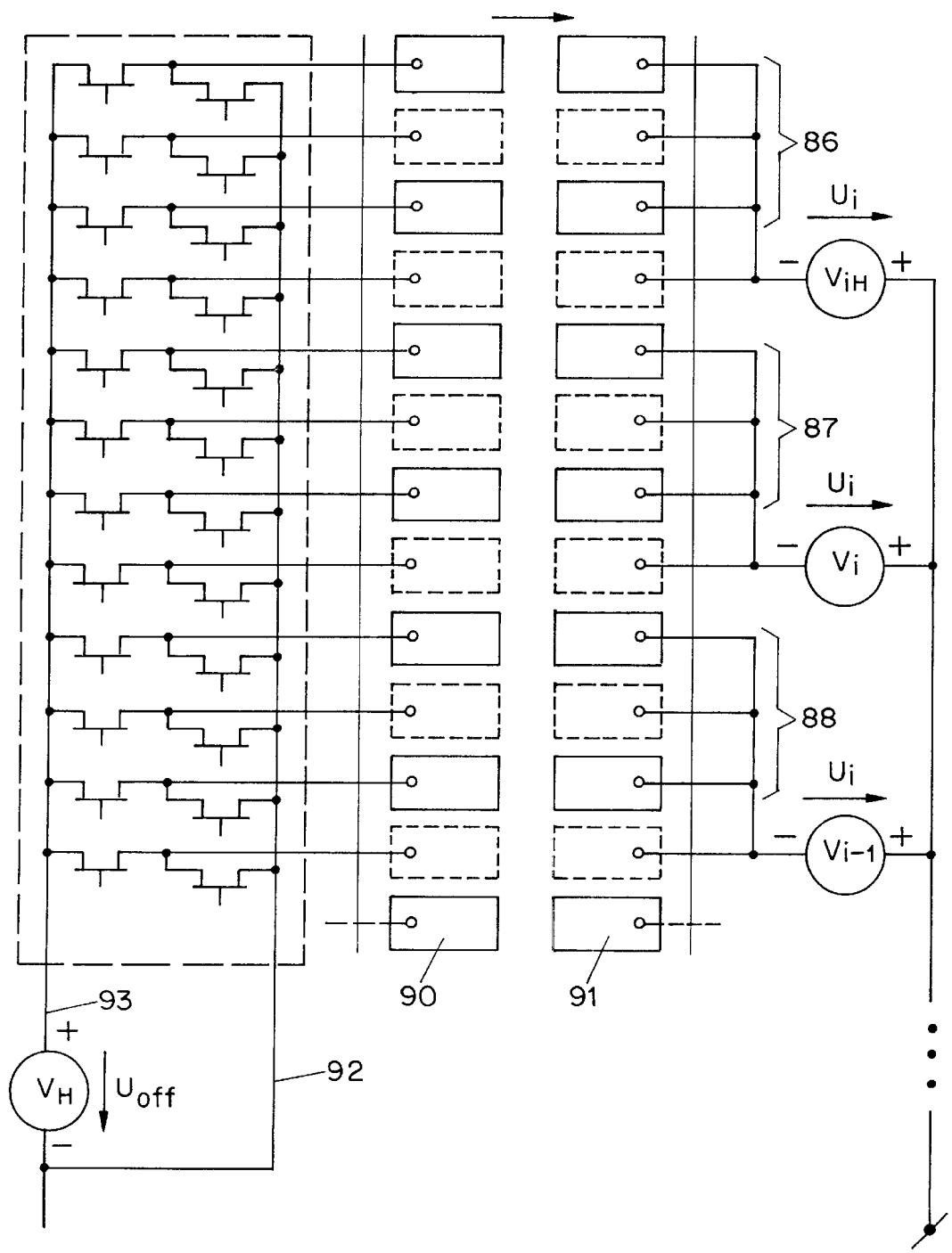
FIG. 6 shows an arrangement in which the controlled counter-electrodes are arranged by groups of four.

In one embodiment of the invention, commercially available circuit boards are used, such as boards available from Supertex as illustrated in FIG. 5 and 6. In these figures, the switches used for correction purposes are arranged by groups of two, as represented at 80. Each group is submitted to the same correcting potential. The electrodes are located alternatively on each side of the substrate, for example electrodes 72, 72' are on the front face and electrodes 73, 73' are located on the back side. A common counter-electrode is shown at 74. The "OFF" potential or blocking voltage is represented as VH. Different potential values used for correction are shown at Vi-1, Vi, Vi+1 etc.

Figure 7:
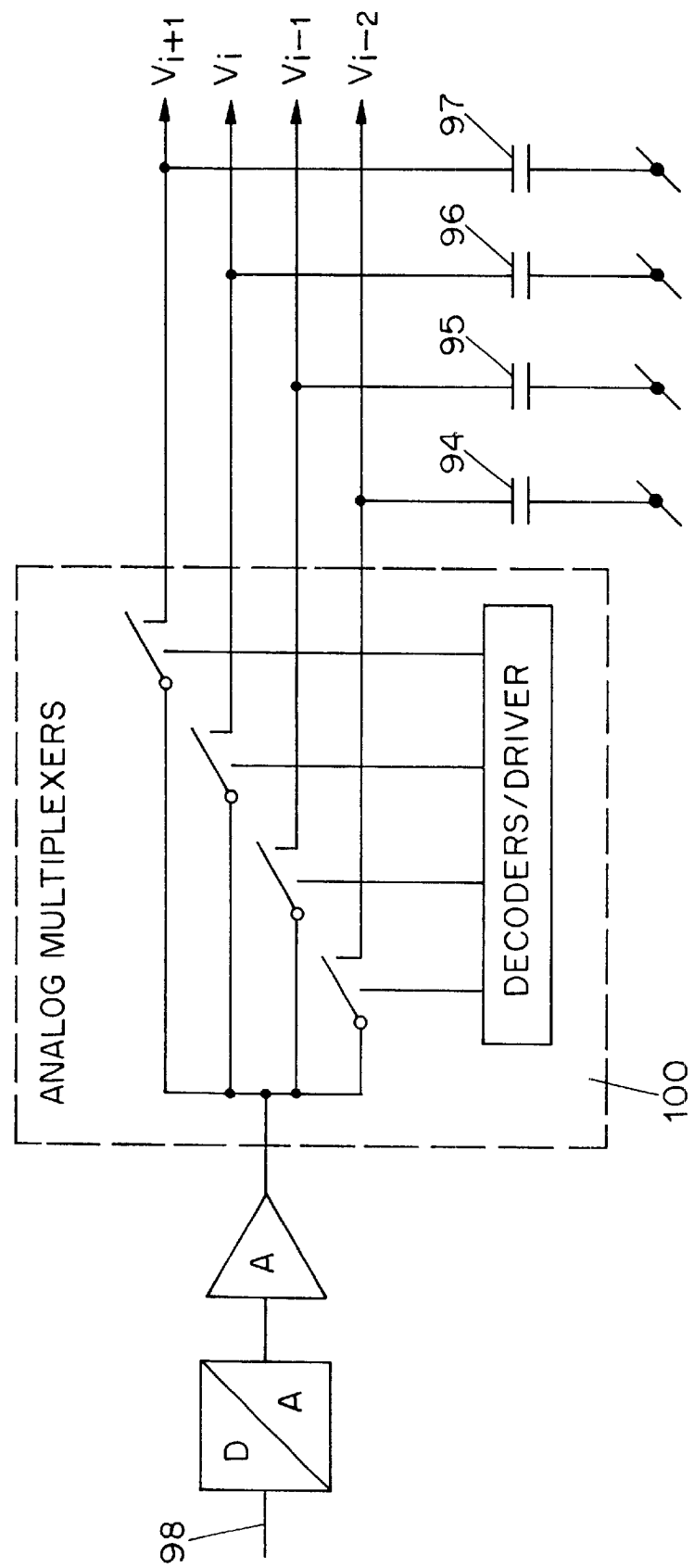
FIG. 7 represents a circuit for the generation of controlling electrical potentials in any modulator.

FIG. 6 shows another circuit board, similar to the board of FIG. 5 but in which electrodes are arranged by groups of four in order to correct four pixels at a time. Correcting potential values are obtained by projecting the imaging pixels to a light detector as explained later in connection with FIGS. 8 and 9. These values are memorized by the arrangement of FIG. 7. A section of a commercially available electronic board is represented at 100. It contains analog multiplexers and decoders-driver. The data necessary for correction, as determined by light detector circuitry, is entered by connecting link 98. Different voltages Vi+1, Vi, Vi-1, Vi-2, memorized in condensers or other memory devices 94 to 97 will be used during the operation of the imager to equalize the light intensities of the pixels.

The generation of correction values will now be described in connection with FIGS. 8 and 9 respectively representing the embodiment of the invention in a PLZT and a TIR modulator.

Figure 8:
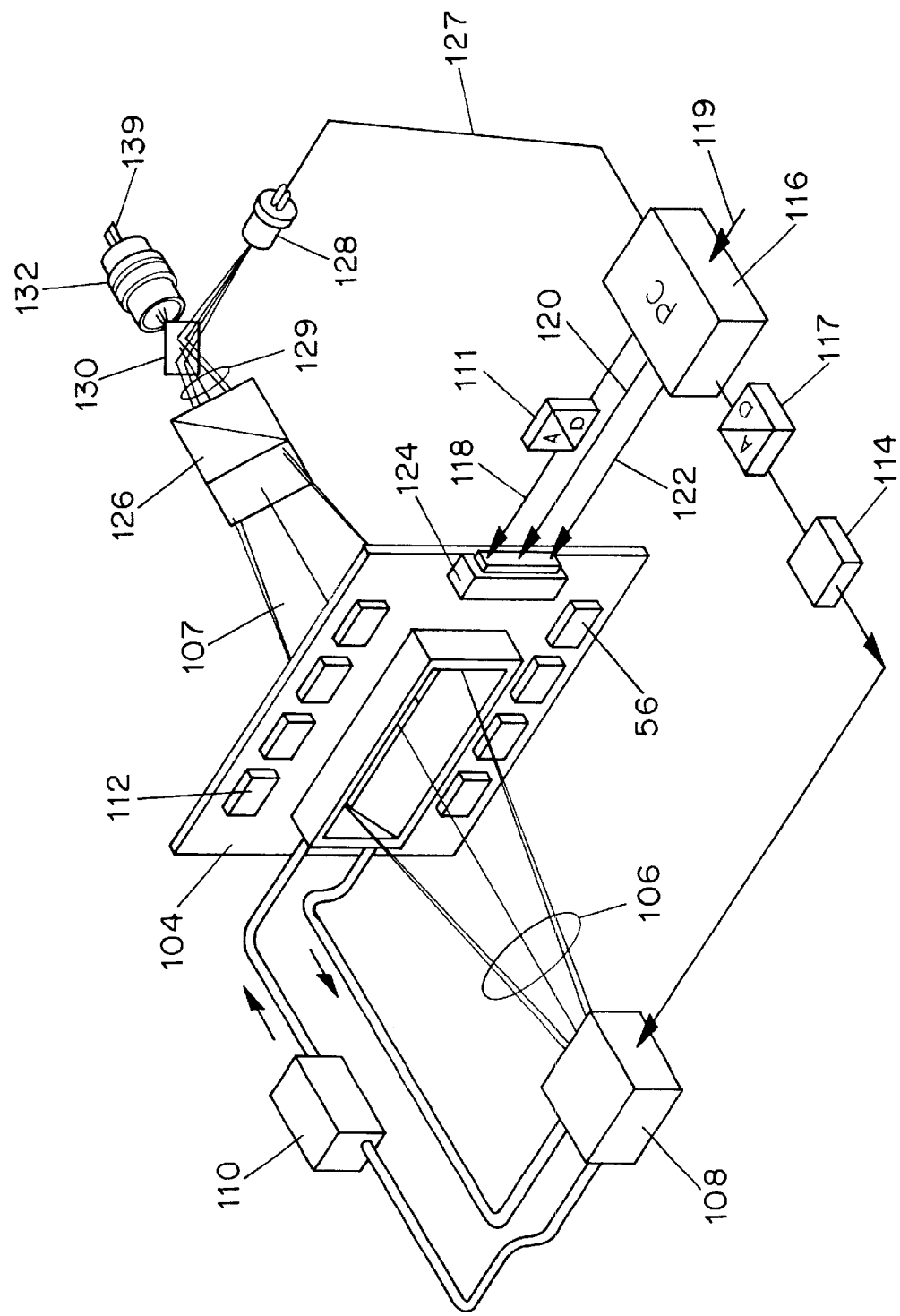
FIG. 8 is a schematic representation of a circuit for the automatic adjustment of pixel intensity in a system based on a PLZT modulator.

FIG. 8 represents the embodiment of the invention in an imager comprising a PLZT modulator. A high power polarized light emitting assembly including laser and optical means is shown at 108. A sheet-like beam of polarized light 106 emerging from this assembly is directed to the inter-electrode gap of the modulator assembly 104. Light beams 107 that have been allowed to cross the polarizer 126 are shown at 129. A relatively small part of these beams of the order of 4%, by example, is deflected by a beam-splitting mirror 130 located between the polarizer and the imaging objective 132. This deflected light reaches detector 128 located at the focal point of a field lens positioned between the modulator and the beam splitter. The function of this field lens is to concentrate the beams emerging from the modulator to the objective lens to decrease its numeric aperture. The advantage of arrangement just described is that each pixel from the modulator arrives exactly at the same location on the surface of the detector. The values detected by the light detector are transferred over connection 127 to processor 116. The D/A converter shown at 117 is connected as shown to power supply 114. Its purpose is to control the laser intensity so that it corresponds to an assigned minimum. A cooling circuit helpful to absorb the heat generated by the high-energy laser unit is show at 110. Processor 116 transfers to the control unit via connector 124 through wiring 118, 120 and 122 data necessary for intensity correction. To obtain these data the modulator is commanded to serially project onto the light detector selected groups of pixels. The identity of each group is, of course, known by processor 116 in which the signals from detector 128 are entered. The intensity of each group of pixel is compared to a reference value entered into block 116 by wire 119, which may correspond to the desired minimum light intensity necessary for equalization. Correction voltages are sent by wire 118 via A/D circuit 111 to control block 124 where they are memorized as commanded by processor 116 which will also control via wiring 122 the voltages applied to certain pixels to bring their intensity to the desired value as explained above. On/Off switching circuits are shown at 112 and storage circuits at 56.

Figure 9:
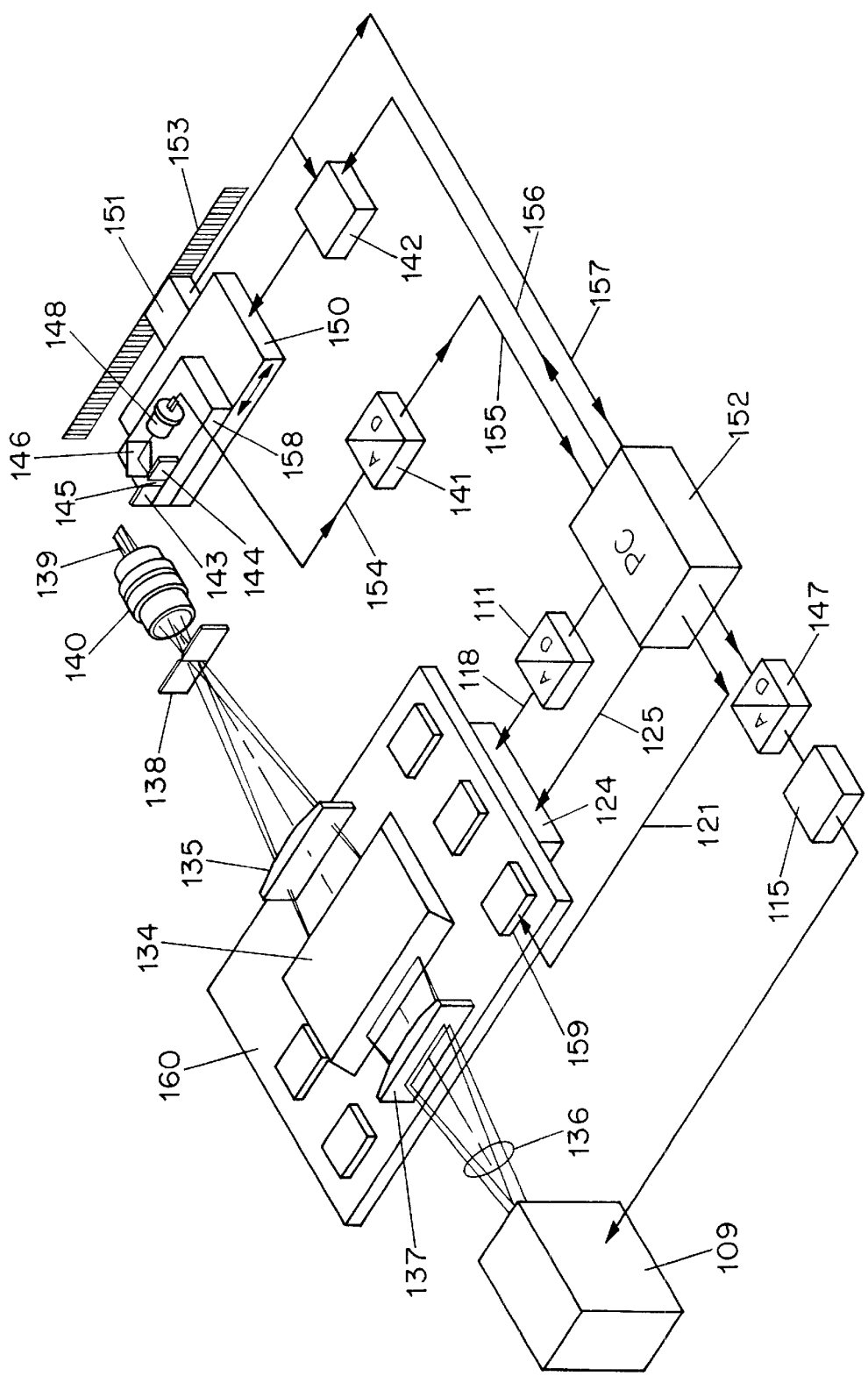
FIG. 9 is a schematic representation of a TIR modulator with mechanical scanning of the image of projected spots in view of correction.

FIG. 9 represents a system similar to the previous one where the PLZT modulator has been replaced by a TIR modulator whose operation is well known in the art. In the present description it is operated in the so-called "bright field" mode. A high-power light-emitting assembly 109 produces a sheetlike beam of light 136 directed to electrooptic material 134, of modulator assembly 160 through lens 137. The diffracted output beams, through lens 135 are directed to stop plate 138 having an aperture allowing only the zero order rays to go through, reach imaging optics 140 and finally the recording plane impinged by image-carrying pixels rays 139. A light measuring assembly is shown at 151. It comprises a carriage 150 that can slide in a direction transverse to the direction of rays 139 in a plane parallel to the recording media. The carriage is provided with a coder cooperating with a grating 133 in order to define its position. Attached to the sliding carriage is a block 158 provided with masks 143 and 144 slightly spaced apart to leave a narrow slit 145 between them. The masks are located on the image recording plane and are made to slide parallel to said plane. Beyond the slit is a partially reflecting mirror 146 directing beams that have passed the slit to light detector 148. The light intensity values produced by the detector are transferred by connection 154 to processor 152 via A/D circuit 141. The A/D converter shown at 147 is connected to power supply 115. Its purpose is to control the laser intensity so that it corresponds to an assigned minimum.

Processor 152 transfers to control unit through connector 124 and chip 159 through wiring 121, 123 and 125 data necessary for intensity correction. To obtain this data the position of imaging head 140 relative to carriage 151 is moved so that the edge of bundle of rays 139 is adjacent to slit 145. The carriage 151 is then moved to serially project pixels onto the light detector one at a time or by selected groups. The identity of each group is, of course known by processor 152 in which the signals from detector 148 are entered. The intensity of each pixel or group of pixels is compared to a reference value entered into block 152 in which a value representing the desired minimum light intensity necessary for equalization has been stored. Correction voltages are sent by wire 118 via A/D circuit 111 to control block 124 where they are memorized as commanded by processor 152 which will also control via wiring 121 the voltages applied to certain pixels to bring their intensity to the desired value as explained above.

Figure 9A:
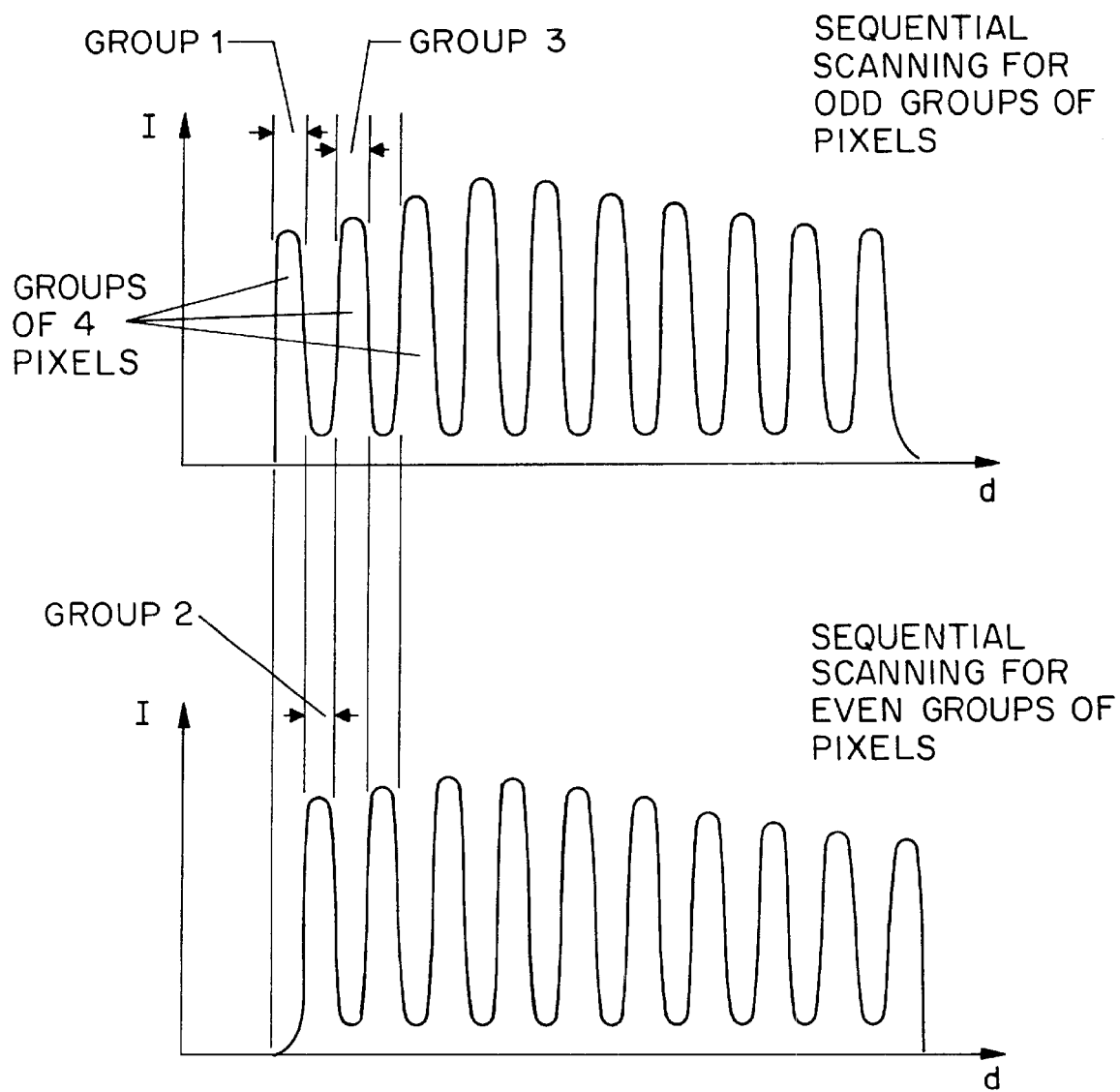
FIG. 9a represents intensity curves obtained by the dynamic measure of the intensity of pixels arranged by groups of four obtained by the scanning arrangement of FIG. 9.

FIG. 9a graphically illustrates how the light detecting arrangement can be utilized. Signals received from photodetector 148 are represented on coordinate "I" and the scanning motion of slit 145 on coordinate "d". Curves, as shown, represent measurement made alternatively by groups of four pixels at a time. All odd number groups are placed in the ON state and all even number groups in the OFF state as follows: 4 ON-4 OFF-4ON-4OFF and so on. The first passage of the signal to a maximum is detected, memorized and affected to the first group of pixels. The second passage is affected to the third group and so on. Then the routine is started again with 4 OFF-4 ON-4 OFF-4 ON and so on. Correction voltages are derived from measured values based on the transmission curve of the modulator in function of the tension (FIG. 2). After these voltages have been applied, new measures are made again to correct, if necessary, residual errors by an interactive process.

The application of the invention to a flat-bed platesetter will now be described with reference to FIGS. 9, 10 to 11b and co-pending European patent application No. 99112797.8 (incorporated herein by reference). The imaging head assembly shown at 260 comprises a pre-modulation optical assembly 202 that could be as described in co-pending European patent application No. 99104943.8 (incorporated herein by reference), a modulator assembly 204 and associated projection optics 206 such as described in co-pending European patent application No. 99104942.0 (incorporated herein by reference). Emerging from the objective lens located at the output of assembly 260 are a multiplicity of individually controllable rays 208. For the imaging of a printing plate such as 214, assembly 260 moves to and fro over the plate along path 230 in order to create successive swaths of pixels. At the completion of each swath, the plate, secured by vacuum grippers attached to plate feeding carriage 218 is moved in the direction of arrow 232 by a distance substantially equal to the width of a swath. The complete imaging of the plate is obtained by a series of adjacent swaths.

When a plate has been completely imaged (plate 214 in the figure), in order to start a calibration cycle, projection head 260 is positioned mid-course, at the center of imaging area 216, for example at location 260' shown in dotted lines over a light detector assembly attached to carriage 218.

Figure 10:
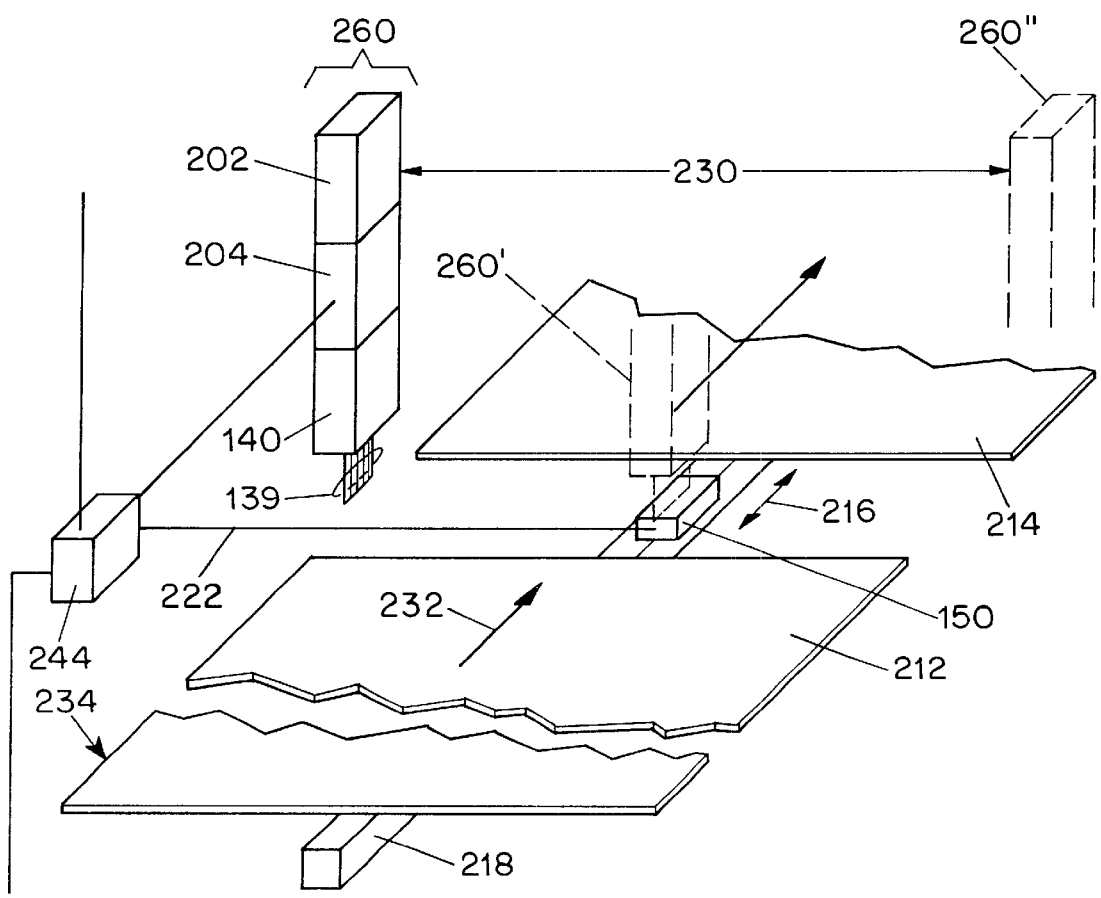
FIGS. 10 to 11b represent schematically parts of a laser platesetter embodying the invention.
Figure 10A:
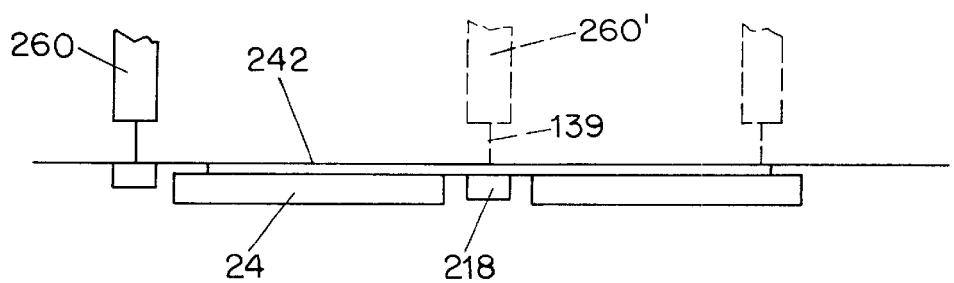
Figure 11A:
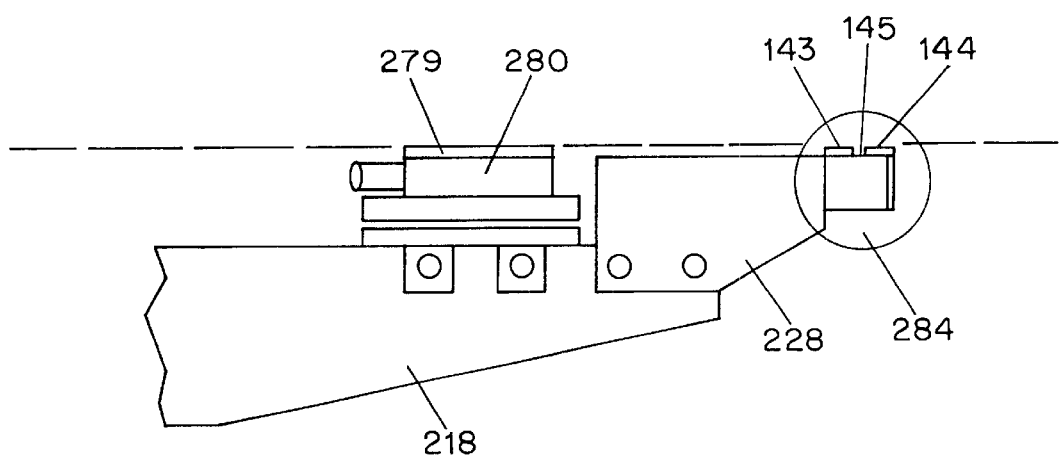
Figure 11B:
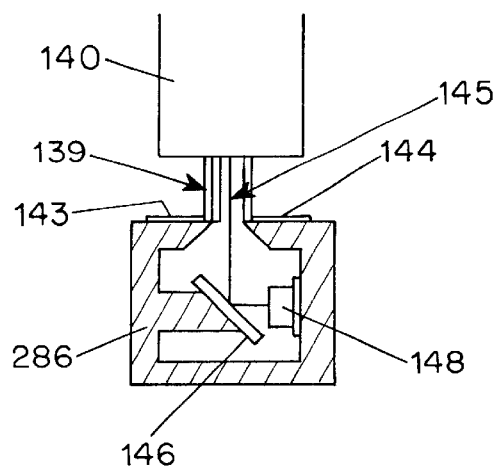

Referring to FIGS. 10 and 10a, attached to the plate feeding carriage 218 is an extension shown more in detail in FIG. 11b. It comprises the same components as in FIG. 9 also represented by the same reference numbers.

Mounted on extension 228 is an assembly comprising plates 143 and 144 leaving between them a slit 143 to allow rays 139 emerging from objective lens 140 to impinge a light detector 148 via deflection mirror 146. These components are located in box 286 attached to extension 228. The light produced by rays 139 is measured in the same manner as described above in connection with FIG. 9, except that the function of separate sliding carriage 151 is replaced by the extension 228. The reading of the light value of pixels is sequentially made by stepping the plate holding carriage by small pre-determined steps under the control of the command of a linear motor as explained in the above-referenced copending European patent application No. 99112797.8. The detecting and storing operation of pixel intensity values is the same as described in conjunction with FIG. 9 and will not be repeated here.

The intensity calibration just described takes advantage of the time elapsed between the completion of the imaging of a plate and the beginning of the imaging of the following plate, as shown in FIG. 10. The arrangement just described does not necessitate a separate light detector carriage but it is limited to one re-calibration per plate. However this frequency has been found sufficient in practice.

The embodiments described herein are included only by way of example and are not meant to limit the scope of the invention. For example, the intensity calibration according to the present invention can be achieved without the specific automated calibration means previously noted by making manual or automated adjustments to the potential of the gating electrodes after observing or measuring banding effects that may appear due to intensity variations on imaged printing plates or other media. The intensity can be recalibrated with a frequency (minutes, hours, days, months, etc.) necessary to correct any unwanted banding effects that appear on the imaged media.

The invention claimed is:

1. A method for controlling the intensity of a pixel or group of pixels at an image plane, said method comprising the step of adjusting the potential of at least one gating electrode of an electro-optic modulator, wherein said adjustment is accomplished by biasing counter-electrodes individually or by groups.

2. The method of claim 1, wherein said adjustment is accomplished by applying to said at least one gating electrode a selected potential.

3. The method of claim 2, wherein an appropriate potential is applied to each group of electrodes.

4. The method of claim 1, wherein said adjustment is such that intensity equalization at the image plane is obtained.

5. The method of claim 1, further comprising the steps of detecting the luminous intensity controlled by said pixel or group of pixels.

6. The method of claim 5, further comprising the step of projecting the light intensity of each pixel or group of pixels to a light detector.

7. The method of claims 5, further comprising the step of obtaining adjusting potential values from said detected light intensity.

8. The method of claim 5, further comprising the step of obtaining adjusting potential values from said detected intensity.

9. The method of claim 8, further comprising the step of comparing the detected light intensity of each pixel or group of pixels to a reference value.

10. The method of claim 9, further comprising the step of determining and adjustment potential value based on the result of said comparing step.

11. The method of claim 8, further comprising the step of memorizing said adjusting potential values in a memory means.

12. The method of claim 11, wherein said memory means comprises at least one capacitor.

13. The method of claim 1, wherein said electro-optic modulator is a PLZT modulator or a TIR modulator.

14. The method of claim 5, further comprising the step of scanning the beam of light with said light detector.

15. An apparatus for controlling the intensity of a pixel or group of pixels at an image plane, comprising adjustment means for adjusting the potential of at least one gating electrode of an electro-optic modulator, wherein said adjustment means comprises bias means for biasing counter-electrodes individually or by groups.

16. The apparatus of claim 15, wherein said adjustment means comprises bias means for applying a selected potential to said at least one gating electrode.

17. The apparatus of claim 16, wherein an appropriate potential is applied to each group of electrodes by said adjustment means.

18. The apparatus of claim 15, wherein said adjustment means provide intensity equalization at the image plane.

19. The apparatus of claim 15, further comprising detecting means for detecting the light intensity of said pixel or group of pixels.

20. The apparatus of claim 19, further comprising projecting means for projecting the light intensity from said pixel or group of pixels to said detecting means.

21. The apparatus of claim 20, wherein said projecting means serially projects the light intensity from selected pixels or group of pixels onto said light detector.

22. The apparatus of claim 19, further comprising processing means for obtaining adjusting potential values for said detected intensity.

23. The apparatus of claim 22 said processing means being for comparing the detected intensity of each pixel or group of pixels to a reference value.

24. The apparatus of claim 23, wherein said adjusting potential values are determined based on the result of said comparison.

25. The apparatus of claim 15, further comprising memory means for memorizing said adjusting potential values.

26. The apparatus of claim 25, wherein said memory means comprises at least one capacitor.

27. The apparatus of claim 19, said detecting means further comprising two masking means being arranged such that a slit is provided in-between.

28. The apparatus of claim 19, wherein said detecting means is provided on a movable carriage means.

29. The apparatus of claim 28, said carriage further comprising a coder cooperating with a grating in order to define the position of said carriage means upon movement.

30. The apparatus of claim 28, wherein said detecting means scans the beam of light.

31. The apparatus of claim 15, wherein said electro-optic modulator is a PLZT modulator or a TIR modulator.

* * * * *